United States Patent
Rajagopalan et al.

(10) Patent No.: US 6,656,840 B2
(45) Date of Patent: Dec. 2, 2003

(54) METHOD FOR FORMING SILICON CONTAINING LAYERS ON A SUBSTRATE

(75) Inventors: Nagarajan Rajagopalan, Santa Clara, CA (US); Joe Feng, Cupertino, CA (US); Christopher S Ngai, Burlingame, CA (US); Meiyee (Maggie Le) Shek, Mountain View, CA (US); Suketu A Parikh, San Jose, CA (US); Linh H Thanh, Cupertino, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/136,455

(22) Filed: Apr. 29, 2002

(65) Prior Publication Data

US 2003/0203614 A1 Oct. 30, 2003

(51) Int. Cl.$^7$ ................................................ H01L 21/44
(52) U.S. Cl. ........................ 438/687; 438/622; 438/680; 438/791; 438/792
(58) Field of Search .................. 438/687, 786, 438/622, 623, 624, 628, 637, 638, 680, 761, 763, 791, 792

(56) References Cited

U.S. PATENT DOCUMENTS

| | | |
|---|---|---|
| 4,532,150 A | 7/1985 | Endo et al. |
| 4,854,263 A | 8/1989 | Chang et al. |
| 5,238,866 A | 8/1993 | Bolz et al. |
| 5,465,680 A | 11/1995 | Loboda |
| 5,773,100 A | 6/1998 | Chang et al. |
| 5,989,623 A | 11/1999 | Chen et al. |
| 6,040,022 A | 3/2000 | Chang et al. |
| 6,100,559 A * | 8/2000 | Park .......................... 257/315 |
| 6,174,810 B1 * | 1/2001 | Islam et al. ................ 438/687 |
| 6,365,518 B1 | 4/2002 | Lee et al. |
| 2002/0115285 A1 * | 8/2002 | Wong ........................ 438/638 |

FOREIGN PATENT DOCUMENTS

WO   WO 00/19508 A1   4/2000

OTHER PUBLICATIONS

Gessner et al, "Nanoporous dielectric materials for Advanced CMOS", Solid State and Integrated Circuit technology, 2nd Proceedings, 6th International Conference, Oct. 22, 2001, vol 1, pp 343–347.*

Sawada, Y. et al. "The Reduction Of Copper Oxide Thin Films with Hydrogen Plasma Generated by an Atmospheric–Pressure Glow Discharge," *J. Phys. D: Appl. Phys.* 1996, pp. 2539–2544, vol. 29.

Yota, J. et al. "Comparison Between HDP CVD and PECVD Silicon Nitride for Advanced Interconnect Applications," *Proceedings of the International Interconnect Technology Conference* 2000, pp. 76–78.

* cited by examiner

*Primary Examiner*—Carl Whitehead, Jr.
*Assistant Examiner*—Thanhha Pham
(74) *Attorney, Agent, or Firm*—Townsend and Townsend and Crew

(57) ABSTRACT

A method for forming a microelectronics device is disclosed. In one embodiment, the method includes depositing a conductive structure on a substrate. A first layer comprising silicon and nitrogen is formed on the substrate. A second layer comprising silicon and nitrogen is then formed on the first layer. The nitrogen to silicon ratio in the first layer is greater than the nitrogen to silicon ratio in the second layer.

18 Claims, 5 Drawing Sheets

METHOD FOR FORMING SILICON CONTAINING LAYERS ON A SUBSTRATE

BACKGROUND OF THE INVENTION

Sub-half micron multilevel metallization is one of the key technologies for the next generation of very large scale integration (VLSI). Multilevel interconnect structures lie at the heart of this technology. Multilevel interconnect structures are used to link individual transistors in an integrated circuit together.

In recent years, copper has been increasingly used in multilevel interconnect structures. Copper, which has been used as a conductive material in interconnect structures, has advantages over aluminum, which was previously the conductive material of choice. Copper is a better conductor of electricity than aluminum. Better conduction results in faster operating speeds and lower operating voltages. Accordingly, copper has replaced aluminum as the interconnect material of choice in a variety of applications.

"Dual-damascene" processes and barrier layers are used to form copper-based multilevel interconnect structures. In a typical dual-damascene process, a dielectric layer is first etched. Metal is deposited in the etched regions, and excess metal is removed using a planarizing process such as a CMP ("chemical mechanical polishing") process.

Diffusion barriers are also formed in copper-based interconnect structures. Diffusion barriers are present between the copper structures and the dielectric layers in a multilevel interconnect structure. The diffusion barriers keep the copper in a copper structure from diffusing into the surrounding dielectric layers and into other areas in the multilevel interconnect structure.

Although the use of barrier layers is effective, during fabrication, copper silicide and/or copper oxide films can form when manufacturing multilevel interconnect structures. For example, copper silicide can form between copper and dielectric layers in a multilevel interconnect structure. Residual copper from the CMP process can smear as a result of polishing, and can reside between adjacent copper lines. When a silicon nitride layer is formed on the smeared copper, the silane that is used to form the silicon nitride layer can react with the smeared copper to form copper silicide.

Copper oxide can also form between layers in a multilevel interconnect structure. For example, during fabrication, copper oxide can form on a copper feature after oxygen in the atmosphere oxidizes the surface of the copper feature. If a barrier layer is subsequently formed on the copper feature, copper oxide may reside between the copper feature and the barrier layer in the formed multilevel interconnect structure.

When copper silicide and/or copper oxide reside at the copper/silicon nitride interfaces in a multilevel interconnect structure, problems such as line leakage, electromigration, and stress migration can occur. "Line leakage" is essentially electrical shorting between adjacent conductive structures. Copper silicide and copper oxide films are conductive. Copper silicide residing between adjacent conductive structures may cause or form a leakage path at the dielectric interface. "Electromigration" relates to the diffusion of conductive atoms such as copper within an interconnect structure. The diffusion may be caused by the potential difference between adjacent conductive structures. Copper oxide can form conductive paths between adjacent structures, thus encouraging electromigration. "Stress migration" refers to the mass transport of interconnect material in response to mechanical stress gradients present in the multilevel interconnect structure. The stress gradients result from thermal expansion coefficient mismatches and compliance mismatches between the conductive features and surrounding (e.g., overlying and/or underlying) dielectric materials. Depending on the thermal history, the stress may be either compressive or tensile. Tensile stress can cause void formation, whereas compressive stress can cause hillock formation. Voids continue to grow to reduce the stress until it is energetically unfavorable for them to continue to grow. Migrating voids may also coalesce with other voids thus providing an effective void growth mechanism. The presence of, for example, copper silicide and copper oxide between layers in a multilevel interconnect structure can induce stress in it.

In view of these and other problems, improved microelectronics devices and methods for forming the same are desirable. Embodiments of the invention address the problems described above, as well as other problems, individually and collectively.

SUMMARY OF THE INVENTION

Embodiments of the invention are directed to microelectronics devices and methods for forming the same.

One embodiment of the invention is directed to a method comprising: (a) forming a conductive structure on a substrate; (b) forming a first layer on the conductive structure, wherein the first layer comprises silicon and an element selected from the group consisting of nitrogen and carbon; and (c) forming a second layer on the first layer, wherein the second layer comprises silicon and the element selected from the group consisting of nitrogen and carbon, wherein the atomic ratio of the element to silicon in the first layer is greater than the atomic ratio of the element to silicon in the second layer.

Another embodiment of the invention is directed to a method comprising: (a) forming a copper structure on a semiconductor substrate; (b) removing copper oxide at the surface of the copper structure; (c) forming a first layer comprising silicon and nitrogen on the copper structure; and (d) forming a second layer comprising silicon and nitrogen on the first layer, wherein the nitrogen to silicon ratio in the first layer is greater than the nitrogen to silicon ratio in the second layer, and wherein the second layer is thicker than the first layer.

Another embodiment of the invention is directed to a method comprising: (a) forming a conductive structure on a substrate; (b) forming a first layer on the substrate by reacting a first compound comprising silicon and a second compound comprising an element selected from the group consisting of nitrogen and carbon; and (c) forming a second layer on the substrate by reacting the first compound and the second compound on the first layer, wherein a molar ratio of the second compound to the first compound in (b) is greater than a molar ratio of the second compound to the first compound in (c).

These and other embodiments of the invention are described in further detail below with reference to the Figures and the Detailed Description.

DETAILED DESCRIPTION

Figure 1:
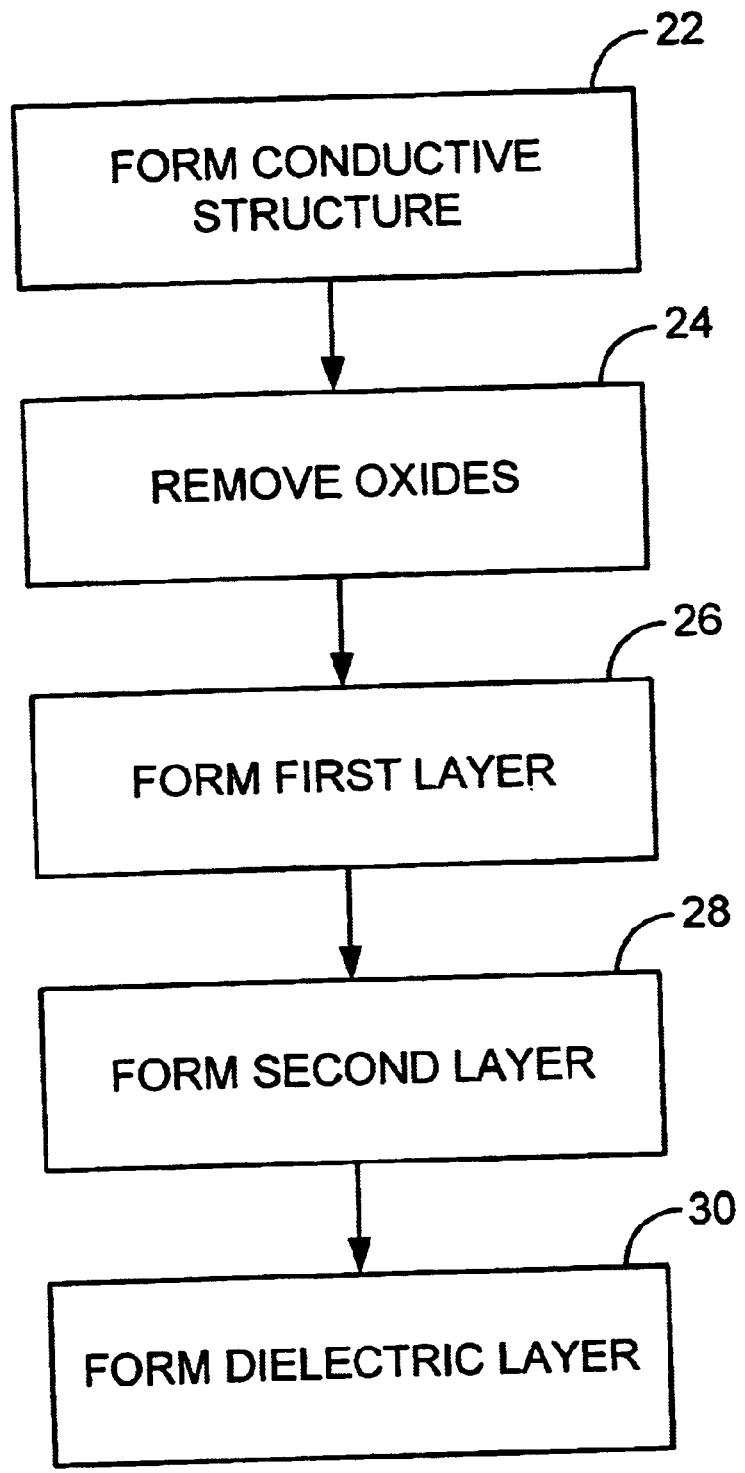
FIG. 1 shows a flowchart showing steps used in a method according to an embodiment of the invention.

FIG. 1 shows a flowchart illustrating an exemplary method according to an embodiment of the invention. The flowchart shows a method including forming a conductive structure (step 22), removing oxides from the conductive structure (step 24), forming a first layer (step 26), forming a second layer (step 28), and forming a dielectric layer (step 30). The individual processes could be performed in separate, uncoupled processing apparatuses. Alternatively, any suitable combination of steps 22, 24, 26, 28, 30 could be performed in different processing apparatuses in a cluster tool.

A conductive structure is first formed on a substrate (step 22). The substrate can be a semiconductor substrate. The conductive structure may be in the form of a layer, line, pad, via, etc., and includes a conductive material such as copper.

In some embodiments, a dual damascene process may be used to form the conductive structure. For example, a patterned dielectric layer with apertures may be formed on a semiconductor substrate. Metal can then be plated (e.g., electroplated) on the semiconductor substrate and may fill the apertures in the dielectric layer. After electroplating, excess metal may extend above the apertures in the dielectric layer. The excess metal may be removed using a process such as a chemical mechanical planarization (CMP) process, which is well known in the art. After performing the CMP process, a conductive structure with a planar surface is then formed.

After forming the conductive structure, surface oxides at the planar surface of the conductive structure can be then be removed (step 24). As noted above, oxygen in the air can oxidize the upper portion of a conductive structure to form a metal oxide layer. This metal oxide layer is sometimes referred to as a "native oxide." A typical native oxide layer may be about 10 to 30 angstroms thick. Exemplary processes for removing surface oxides are provided below.

After removing oxides from the conductive structure, a first layer is formed on the conductive structure (step 26). The first layer can comprise silicon and an element selected from the group consisting of nitrogen and carbon. In the first layer, the silicon, and nitrogen or carbon, may form binary compounds (e.g., silicon carbide or silicon nitride) or ternary compounds.

After forming the first layer, a second layer is formed on the first layer (step 28). The first layer is then between the substrate and the second layer. Like the first layer, the second layer also comprises silicon and an element selected from the group consisting of nitrogen and carbon. The second layer may also comprise compounds such silicon nitride or silicon carbide.

Although both the first and second layers comprise silicon and an element such as nitrogen or carbon, the atomic ratio of carbon or nitrogen, to silicon in the first layer is greater than the atomic ratio of the carbon or nitrogen, to silicon in the second layer. For instance, in some embodiments, both the first layer and the second layer may be characterized by the general formula $Si_xC_y$, or $Si_xN_y$, where x and y are each greater than 0 about 1. However, the ratio of y to x in the first layer is greater than the ratio of y to x in the second layer. For example, if both the first layer and the second layer comprise silicon and nitrogen, the atomic ratio of the element to silicon in the first layer (e.g., N:Si) may be about 1.55. The atomic ratio of the element to silicon in the second layer (e.g., N:Si) may be about 1.33 (e.g., $Si_3N_4$). When the ratio of nitrogen to silicon is about 1.2 to 1.4 in a silicon nitride layer, the silicon nitride layer may be referred to as a "stoichiometric" silicon nitride layer. When the ratio of nitrogen to silicon is greater than about 1.4 in a silicon nitride layer, the silicon nitride layer may be referred to as a non-stoichiometric, nitrogen-rich silicon nitride layer. Thus, in some embodiments, the first layer may include $Si_xC_y$, or $Si_xN_y$, where the ratio of y to x is about 1.4 or more, and the second layer may include $Si_xC_y$, or $Si_xN_y$, where the ratio of y to x is about 1.4 or less.

The first and second layers may have any suitable characteristics. For instance, the first and second layers may be amorphous, crystalline, or semicrystalline. Also, other elements such as hydrogen and oxygen can be present in the first and second layers in addition to silicon, and nitrogen or carbon. For instance, in some embodiments, both the first and the second layers may comprise silicon, oxygen, and nitrogen. For example, both the first and second layers may comprise $Si_xO_yN_z$ and $Si_xO_yN_z$:H, wherein x, y, and z are each individually greater than 0 and less than about 1. However, the ratio of z to x may be greater in the first layer than in the second layer. Regardless of the particular chemical compositions of the first and second layers, the dielectric constants of the first and second layers are desirably low (e.g., less than about 7 for $Si_xN_y$ materials and less than about 5.0 for $Si_xC_y$ materials).

Together, the first and second layers may form a barrier structure on a conductive structure. The barrier structure can prevent diffusion between the conductive structure and an adjacent (e.g., overlying or an underlying) dielectric layer. The combined first and second layers may alternatively or additionally be sublayers in an etch stop layer, a passivation layer, or a dielectric layer in a microelectronics device.

Both the first and the second layers can be formed using the same general process. However, adjustments to one or more process parameters may differentiate the process for forming the first layer and the process for forming the second layer. For example, both the first layer and the second layer may be formed using a chemical vapor deposition (CVD) process such as a PECVD (plasma enhanced chemical vapor deposition) process or a HDP-CVD (high density plasma—chemical vapor deposition) process. One or more process parameters (e.g., the gas flow rates of one or more process gases) may be adjusted at the start of the process for forming the second layer, while a majority of processing parameters (e.g., power and substrate temperature) may remain the same. Because the first and second layers and the processes for forming them are similar, yet different, the process of forming the first layer may be characterized as a "pre-deposition" process with respect to the second process in some embodiments.

In some embodiments, the molar ratio of the process gases can be adjusted after the first layer is formed. For instance, $SiH_4$ and $N_2$ (without ammonia) can be used to form the first layer and $SiH_4$ and $N_2$ (without ammonia) can be used to form the second layer. However, the molar ratio of $N_2$ to $SiH_4$ used in the process of forming the first layer is greater than the molar ratio of $N_2$ to $SiH_4$ used in the process for forming the second layer. In another example, $SiH_4$ and $N_2$ and $NH_3$ can be used to form the first layer and $SiH_4$ and $N_2$ and $NH_3$ can be used to form the second layer. However, the molar ratio of $NH_3$ to $SiH_4$ used in the process of forming the first layer is greater than the molar ratio of $NH_3$ to $SiH_4$ in the process for forming the second layer. In these examples, the molar ratio of nitrogen or ammonia to silane is greater when forming the first layer than when forming the second layer, so that the formed first layers are "nitrogen-rich" as compared to the subsequently formed second layers.

The gas flow rate of one or more process gases can be adjusted to change the molar ratio of the process gases at the start of the process for forming the second layer. For example, the gas flow rate of silane can be gradually or abruptly adjusted at the start of the process for forming the second layer to change the molar ratio of the nitrogen-containing gas to silane. By adjusting the gas flow rate of silane into the processing chamber between the process for forming the first layer and the process for forming the second layer, the silane burst into the process chamber is minimal.

Reducing the amount of silane that is introduced into the process chamber, reduces the likelihood of forming copper silicide at the upper surface of the conductive structure. Less silane means that less silicon is available to form silicide, so that the likelihood of having copper silicide in the formed interconnect structure is reduced. Problems such as line leakage, electromigration, and stress migration are also reduced in the formed interconnect structure.

The formed first and second layers may have any suitable thickness. For example, the first layer may have a thickness of less than about 60 angstroms (e.g., between about 30 to about 60 angstroms), while the second layer may have a thickness of above 100 angstroms (e.g., between about 100 angstroms to about 1000 angstroms). Accordingly, in some embodiments, the second layer is thicker than the first layer. The ratio of the thickness of the second layer to the first layer can be greater than 1. In some embodiments, the ratio of the thickness of the second layer to the first layer can be greater than about 3. Of course, the thicknesses of the first and second layers, however, may vary depending upon the particular device being fabricated.

In an illustrative embodiment, a first compound such as silane ($SiH_4$) and a second compound such as nitrogen ($N_2$) can be used to form a first layer comprising silicon nitride. These gases may be introduced into a processing chamber containing a substrate having a conductive feature on it. The substrate may be heated to an appropriate processing temperature. The following reaction may take place on the conductive structure to form the silicon nitride layer.

$$SiH_4 + N_2 \rightarrow Si_3N_4 + H_2 \tag{1}$$

After forming the first layer comprising silicon nitride, a second layer comprising silicon nitride can be formed on the first layer. The first and second compounds and the same general reaction may also be used to form a second layer. However, the molar ratio of the second compound (e.g., nitrogen) to the first compound (e.g., silane) is greater when forming the first layer than when forming the second layer. The molar ratio of process gases can be changed by adjusting the flow rates of the process gases. As an example, if silane and nitrogen (e.g., without ammonia) are used to form silicon nitride in both the first and second layers, the flow rate of silane in the process of forming the second layer may be increased, relative to the flow rate of silane used in the process of forming the first layer. For instance, the flow rate of silane may be about 4 times greater in the process of forming the second layer than the process for forming the first layer. Illustratively, the gas flow rate of nitrogen into a PECVD processing chamber may be about 5000 sccm (standard cubic centimeters per minute), while the gas flow rate of silane may be about 27 sccm when forming the first layer. After forming the first layer, the gas flow of silane into the processing chamber may be increased once the process of forming the second layer starts. For example, the flow rate of silane may be increased to about 110 sccm, while the flow rate of nitrogen is maintained at about 5000 sccm, when forming the second layer.

In some embodiments, the oxide removal process (step 24), the formation of the first layer (step 26), and the formation of the second layer (step 28) are all performed in the same processing chamber in the same processing apparatus. For example, the oxide removal process, the formation of the first layer, and the formation of the second layer, may all take place within a CVD processing chamber in a CVD processing apparatus. By performing all of these processes in the same processing chamber, processing times are reduced since substrates need not be transferred out of the chamber and into another chamber. Also, forming the first layer on the conductive structure immediately after removing oxides from the conductive structure reduces the likelihood that metal oxides will re-form at the upper surface of the conductive structure. This reduces the chance that metal oxides such as copper oxide will be present in the formed interconnect structure. Problems such as line leakage, electromigration, and stress migration are also reduced in the formed interconnect structure.

After forming the second layer, a dielectric layer can be formed on the second layer (step 30). The dielectric layer may be solid or porous, and has a dielectric constant. In one embodiment, the dielectric layer is a porous oxide dielectric layer (e.g., a mesoporous oxide layer) that has a dielectric constant less than about 3.0. Additional details about forming porous oxide layers and other dielectric layers are provided below.

The resulting multilevel interconnect structure has low dielectric constant dielectric layers. The interconnect structure also has favorable electromigration, stress migration, and line leakage properties. As noted, the first layer is adjacent to the conductive structure and has a lower silicon concentration than the second layer. The lower silicon concentration in the first layer decreases the likelihood of forming silicides at the surface of the conductive structure. Moreover, oxides are removed from conductive structures before barrier layers are formed on them. By decreasing the likelihood of forming silicides and removing oxides at the surface of the conductive structure (e.g., in between conductive lines), properties such as line leakage, electromigration, and stress migration are improved.

Specific embodiments of the invention can be described with reference to both FIG. 1 and FIGS. 2(a) to 2(g). FIGS. 2(a) to 2(g) show partial cross-sections of a substrate and interconnect structure as the interconnect structure is being formed using a dual damascene process.

Figure 2A:
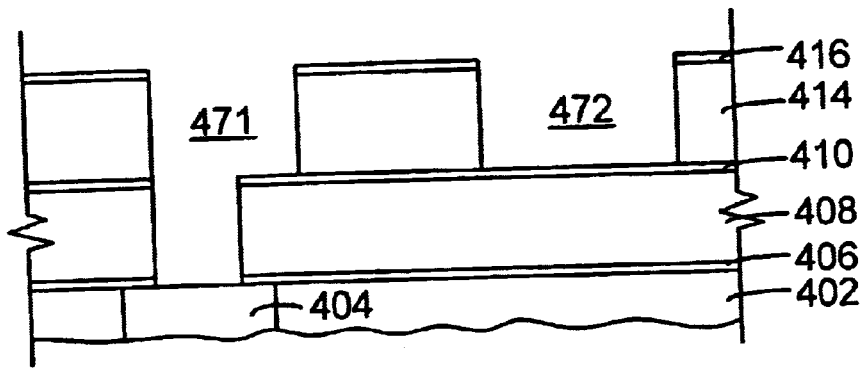
FIGS. 2(a) to 2(g) show cross-sections of structures formed in steps in a method according to an embodiment of the invention.
Figure 2B:
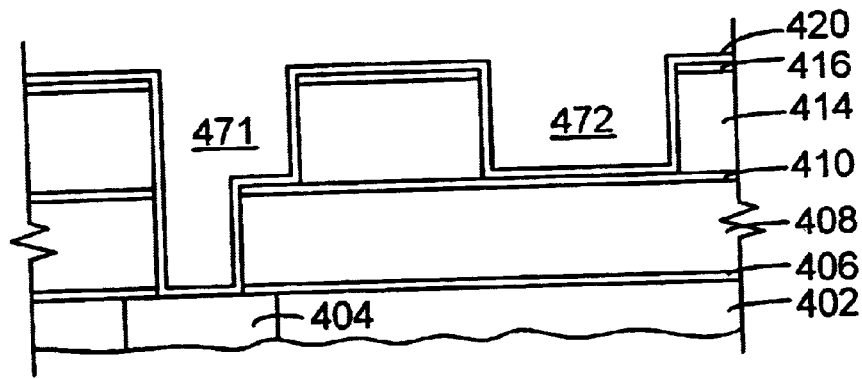
Figure 2C:
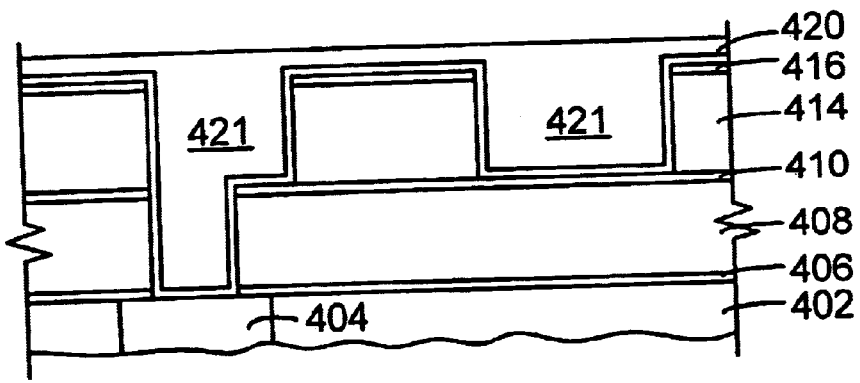
Figure 2D:
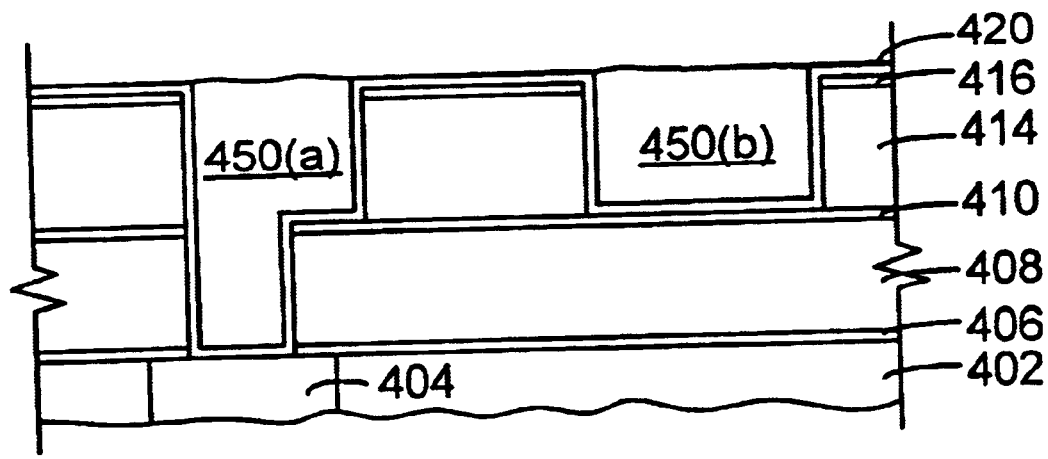

FIG. 2(a) shows a substrate 402 with a conductive feature 404. The conductive feature 404 may be, for example, a bond pad. The substrate 402 may comprise a semiconductor substrate with or without additional layers of material on it. The semiconductor substrate may be, for example, a silicon or gallium arsenide wafer.

First and second dielectric layers 408, 414 are on the substrate 402. The first and second dielectric layers 408, 414 may have any suitable characteristics. For instance, the first and second dielectric layers 408, 414 may comprise any suitable material. In some embodiments, the first and second dielectric layers 408, 414 may comprise a mesoporous oxide material. Each of the first dielectric layer 408 and the second dielectric layer 414 may have any suitable thickness. For example, each of the first and the second dielectric layers 408, 414 may have a thickness between about 5,000 to about 10,000 Å, depending on the size of the device being fabricated.

Etch stop layers 406, 410, 416 may be provided on opposite sides of the first and second dielectric layers 408, 414. In the example shown in FIG. 2(*a*), a first etch stop layer 410 is located between the first and second dielectric layers 408, 414, and a second etch stop layer 416 is disposed on the second dielectric layer 414. A substrate etch stop layer 406 is between the first dielectric layer 408 and the substrate 402. In some embodiments, etch stop layers such as the etch stop layers 406, 410, 416 may be omitted.

Each etch stop layer 406, 410, 416 may comprise any suitable material and may have any suitable thickness. For example, the etch stop layers 406, 410, 416 may comprise silicon nitride or amorphous silicon carbide. Each etch stop layer 406, 410, 416 may also have a thickness between about 200 Å to about 1000 Å.

The structure shown in FIG. 2(*a*) includes a first aperture 471 and a second aperture 472. In this example, the first aperture 471 extends through both the first and second dielectric layers 408, 414. The second aperture 406 extends through the second dielectric layer 414, but not the first dielectric layer 408. Both the first and second apertures 471, 472 are eventually filled with a conductive material. The filled apertures form conductive vias that provide vertical conductive paths through the final multilevel interconnect structure.

Additional details regarding the formation of the structure shown in FIG. 2(*a*) can be found in U.S. patent application Ser. No. 09/502,126, entitled "A Process and an Integrated Tool For Low K Dielectric Deposition Including a PECVD Capping Module", filed Feb. 1, 2000. This U.S. Patent Application is herein incorporated by reference in its entirety for all purposes and is assigned to the same assignee as the present application.

Referring to FIG. 2(*b*), after the first and the second apertures 471, 472 are formed, a liner layer 420 is deposited on the substrate 402 and coats the walls of the apertures 471, 472 as well as the top surface of the second etch stop layer 416. The liner layer 420 may be formed using processes such as CVD, sputtering, electroplating, etc.

A suitable liner layer 420 may comprise a conductive material such as tantalum, tantalum nitride, or tungsten nitride. The liner layer 420 serves as a barrier for the copper that will be deposited in the apertures 471, 472. The liner layer 420 prevents copper migration into the surrounding silicon and/or dielectric material.

I. Forming a Conductive Structure

One or more conductive structures are formed on the substrate 402. The one or more conductive structures may be formed within one or more dielectric layers in some embodiments. The conductive structures may be in any suitable form including conductive lines, vias, layers, and pads. Conductive structures such as these may be formed by any process including a dual damascene process. In another embodiment, a conductive structure may be in the form of a continuous layer of metal.

Referring to FIG. 2(*c*), a conductive material 421 is deposited on the liner layer 420 and within the first and second apertures 471, 472. The deposited conductive material 421 may comprise any suitable metal including oxidizable metals. Examples of oxidizable metals include aluminum, copper, tungsten, as well as alloys or combinations thereof. Copper is a desirable conductive material, because it has a lower resistance than metals such as aluminum (1.7 mW-cm for copper as compared to 3.1 mW-cm for aluminum). The conductive material 421 may include pure metals, or metal alloys.

Any suitable process may be used to deposit the conductive material 421 on the substrate 402. Exemplary processes include chemical vapor deposition (CVD), plasma enhanced chemical vapor deposition (PECVD), physical vapor deposition (PVD), electroplating, electroless plating, sputtering, etc.

In some embodiments, the conductive material 421 is electroplated on the substrate 402. Electroplating processes are well known. In a typical electroplating process, a conductive seed layer (not shown) is deposited on the liner layer 420. If the conductive material to be deposited comprises copper, then the seed layer may also comprise copper that is electrolessly plated. During electroplating, copper ions in solution deposit onto the seed layer and fill the apertures 471, 472. As shown in FIG. 2(*c*), the deposited conductive material 421 extends above the apertures 471, 472.

After the apertures 471, 472 are filled with the conductive material 421, the upper surface of the deposited conductive material 421 is planarized. A chemical mechanical polishing (CMP) process (step 22 in FIG. 1) may be used to planarize the deposited conductive material 421. In a chemical mechanical polishing process, a chemical slurry including an abrasive and chemicals are used to remove materials and planarize a surface. As shown in FIG. 2(*d*), after planarizing using a CMP process, conductive structures 450(*a*), 450(*b*) with planar surfaces are formed. In this example, the formed conductive structures 450(*a*), 450(*b*) are disposed within the first and/or second dielectric layers 408, 414.

II. Removing Oxides From the Conductive Structure

After planarizing the deposited conductive material 421, an oxide removal process is performed (step 24 in FIG. 1). The oxide removal process removes metal oxides at the surface of the deposited conductive material 421. Oxygen in the air or oxidizing agents from prior processes such as a CMP process can oxidize metal at the surface of the first layer 132 to form an oxide layer on the planarized conductive material 421.

It is desirable to remove an oxide layer at the surface of a conducting layer. For instance, an oxide layer can also decrease the adhesion between adjacent layers. For example, copper oxide disposed between a copper conductor layer and an overlying silicon nitride dielectric layer can reduce the adhesion between these layers, and can also cause electromigration, stress migration, and line leakage problems in the formed interconnect structure.

Any suitable oxide removal process may be used in embodiments of the invention including in-situ plasma processes. In some embodiments, a reducing gas is introduced to a plasma processing chamber to reduce the oxidation state of the metal in the oxide layer and transform the oxide layer into metal. The reducing gas may be in the form of a plasma. When the plasma contacts the oxide layer, the plasma reduces the metal in the oxide layer.

Any suitable reducing gas composition may be used to remove the oxide layer. For example, the reducing gas composition may comprise a reducing gas such as $NH_3$ and an inert gas such as argon. In some embodiments, the ratio of the flow rates of the reducing gas to the inert gas may be about 1:20 or less. For example, the flow rate of $NH_3$ into the processing chamber may be 300 sccm and the flow rate of argon into the processing chamber may be about 7500 sccm. In another example, $H_2$ may be used as a reducing gas, alone or in combination with an inert gas. $H_2$ may be ionized to atomic hydrogen. Atomic hydrogen can reduce metal in a metal oxide such as copper oxide according to the following formula:

$$Cu_2O + 2H \rightarrow 2Cu + 2H_2O \quad (2)$$

In other embodiments, a substrate may be annealed in an $H_2$ atmosphere, without forming a plasma, to reduce metal in a metal oxide, thus removing the metal oxide.

In yet other embodiments of the invention, the oxide layer may be removed by using a suitable plasma etch process. In a typical etch process, an etchant such as a halogen based etchant (e.g., $CF_4$) may be used. Regardless of the specific oxide removal process used in the first process, an end-point detector in the processing apparatus can determine when all of oxide at the surface of the first layer is removed so that the oxide removal process can be terminated. Alternatively, the oxide removal process can be a timed process.

The oxide removal process may be performed at low temperatures (e.g., less than about 350° C.). By performing the oxide removal process at a low temperature, the risk of undesired changes in the substrate due to high temperatures is reduced. For example, when copper oxide is removed from a copper structure at 400° C., the temperature at which silicon nitride is formed, a number of "hillocks" can be formed in the copper structure. When a silicon nitride layer is formed on a hillock-containing copper structure, the resulting silicon nitride layer may be uneven. Layers, such as dielectric layers, that are formed on the uneven silicon nitride layer may also be uneven, thus potentially resulting in defects in the formed circuit structure.

III. Forming the First Layer

Figure 2E:
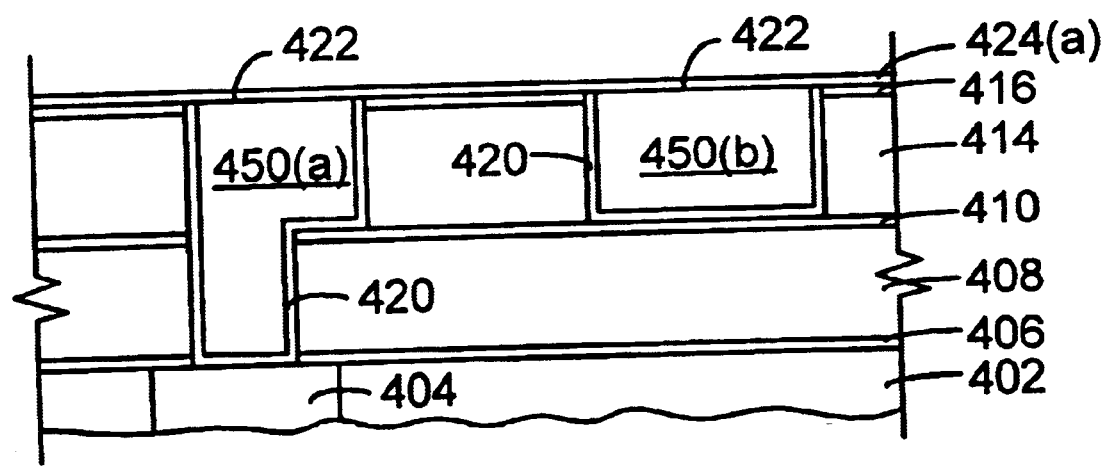

Referring to FIG. 2(e), after planarizing the conductive material and removing metal oxides, a first layer 424(a) is formed on the conductive structures 450(a), 450(b). Any suitable process may be used to form the first layer 424(a). As noted above, exemplary processes include chemical vapor deposition (CVD) processes such as PECVD and HDP-CVD processes.

In some embodiments, the first layer 424(a) may comprise silicon and an element such as carbon or nitrogen. A gaseous mixture comprising a first gas including a first compound and a second gas including a second compound is introduced to a processing chamber. The first compound comprises silicon, while the second compound comprises carbon or nitrogen. For example, if the first layer 424(a) includes silicon carbide, the first compound may be a silicon-containing compound such as $SiH_4$, $Si_2H_6$, or $SiCl_4$. The second compound may be a carbon-containing molecule such as $C_2H_2$, $CH_3$, $CCl_4$, $CH_4$, etc. The gaseous mixture may also include diluents such as nitrogen or argon, and optionally other reactant gases. In a plasma CVD process, the first and second compounds (and optionally other compounds) may be ionized (with the aid of a plasma), and then may react on the substrate (e.g., on a conductive structure on a substrate) to form the first layer 424(a).

As noted above, in some embodiments, the first layer 424(a) comprises silicon nitride. Exemplary first compounds useful for forming silicon nitride include silicon-containing compounds such as silane ($SiH_4$) and dichlorosilane ($SiH_2Cl_2$). Examples of second compounds include nitrogen-containing compounds such as nitrogen ($N_2$) and ammonia ($NH_3$).

Silicon nitride can be formed using any suitable CVD process. In a typical plasma enhanced CVD process for forming a nitride, the substrate is heated to a temperature of about 200° C. to about 400° C., or more. A non-plasma enhanced CVD process may use process temperatures in the range of about 600° C. to about 1000° C. Regardless of the particular process temperature used, in a CVD process, reactant gases then react at the surfaces of the conductive structures 450(a), 450(b) and the second dielectric layer 414 to form a silicon nitride layer.

Any suitable reaction scheme (e.g., a binary reaction scheme) may be used to form the first layer 424(a). The first layer 424(a) can be the reaction product of two or more gas phase reactants. For example, silicon nitride can be formed using the reaction in equation (1) above. In another example, silicon nitride can be formed using the reaction in equation (3) below.

$$SiH_4 + NH_3 + N_2(\text{diluent}) \rightarrow Si_xN_yH_z \quad (3)$$

In equation (3), x, y, and z may have any suitable values. In some embodiments, x, y, and z, may be between above 0 and less than about 1.

In some embodiments, the reaction shown in equation (1) can be used. In the reaction scheme shown in equation (1), no ammonia is used to form the silicon nitride layer. Reducing or eliminating ammonia when forming a silicon nitride layer is advantageous in situations where, for example, the nitride layer is formed on an organic, low dielectric constant dielectric material such as SiLK™ (commercially available from Dow Chemical) that could be inadvertently etched by ammonia.

Reducing the amount of ammonia used in processing also reduces the amount of hydrogen in the formed silicon nitride layer. When a silicon nitride layer is formed by the reaction scheme shown in equation (1), the hydrogen content is about 9% (atomic percent). When a silicon nitride layer is fabricated using the reaction scheme shown in equation (3), the hydrogen content is about 13% (atomic percent). Hydrogen amounts within a formed layer can be determined using Rutherford Backscattering Spectroscopy (RBS) and Hydrogen Forward Scattering spectroscopy (HFS).

Less hydrogen in, for example, a silicon nitride layer is generally desirable. Hydrogen can diffuse to other layers and can sometimes interact with constituents of adjacent layers. For example, if a FSG (fluorine doped silica glass) is deposited on a silicon nitride layer with a high hydrogen content, the hydrogen in the silicon nitride layer can diffuse to the FSG layer/silicon nitride interface and can form HF acid with the fluorine in the FSG layer. The HF can potentially weaken the interface between the FSG layer and silicon nitride layer. Accordingly, it is desirable to minimize the amount of hydrogen in the first and second layers in embodiments of the invention.

Any suitable type of deposition apparatus may be used to form the first layer 424(a) (and also the second layer). For example, a PECVD apparatus including a parallel plate RF vacuum chamber may be used. A power supply operating at about 13.56 MHz may be used to generate a plasma in the chamber. The apparatus may have a faceplate with apertures, where the faceplate is close to the substrate in the chamber. Each aperture in the faceplate has a gas inlet end and a gas outlet end larger than the inlet end. In some embodiments, the apertures may be conical. RF energy is applied to the faceplate while reactant gases flow through the apertures. With a faceplate of this type, the reactant gases being introduced to the substrate can dissociate more effectively than in apertures that have gas inlet ends and gas outlet ends of the same size. This is useful if the gas to be disassociated is nitrogen, since $N_2$ is difficult to dissociate.

Figure 3:
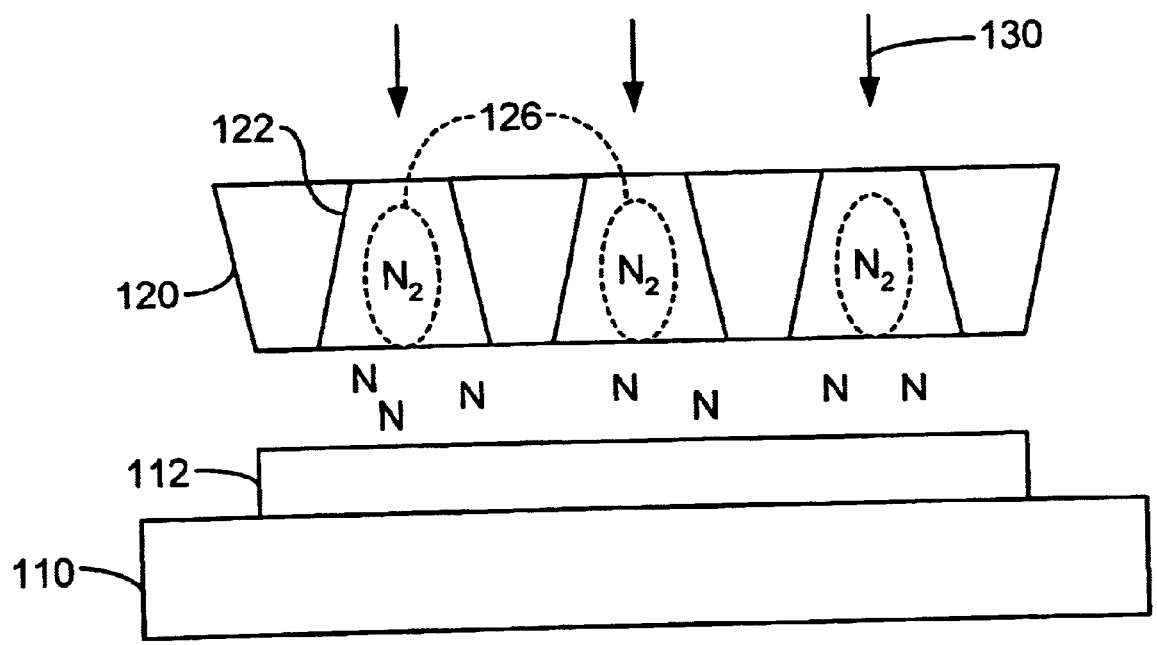
FIG. 3 shows a schematic drawing of a portion of a PECVD apparatus that can be used to form the first and second layers in embodiments of the invention.

FIG. 3 shows a schematic illustration of a faceplate of this type in relation to a substrate. In FIG. 3, a faceplate 120 with conical apertures 122 disposed above a substrate 112. The substrate 112 rests on a substrate support 110. As shown in FIG. 3, reactant gases 130 can be introduced to the substrate 112 by first passing through the conical apertures 122 in the faceplate 120. The reactant gases 130 can dissociate within the conical apertures 122 as shown by lines 126. The reactant gases 130 dissociate to a greater extent than would be the case if the apertures in the faceplate 120 were cylindrical. Other details regarding PECVD apparatuses of this type can be found in U.S. Pat. No. 5,773,100, which is herein incorporated by reference in its entirety for all purposes and is assigned to the same assignee as the present application.

IV. Forming a Second Layer

Figure 2F:
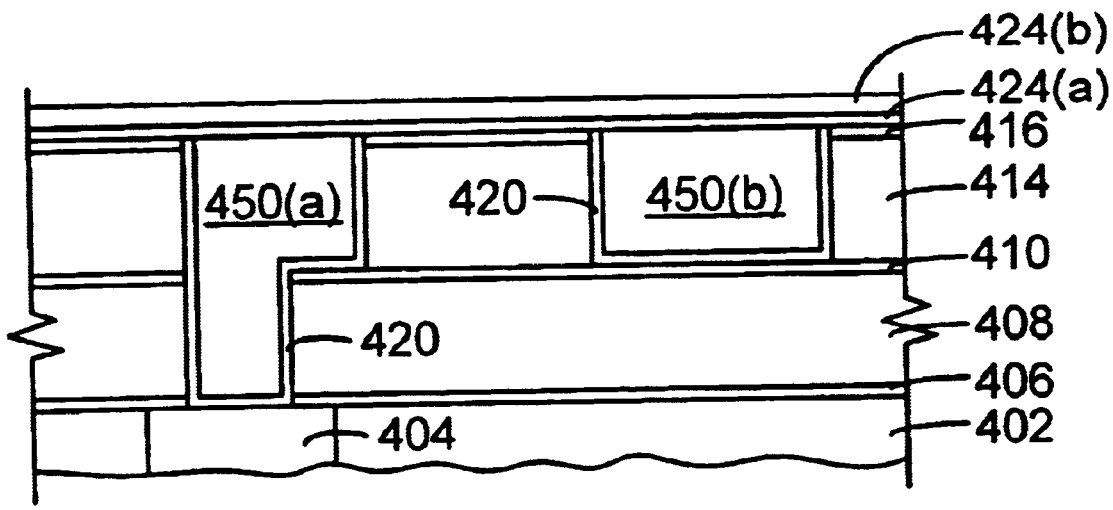
Figure 2G:
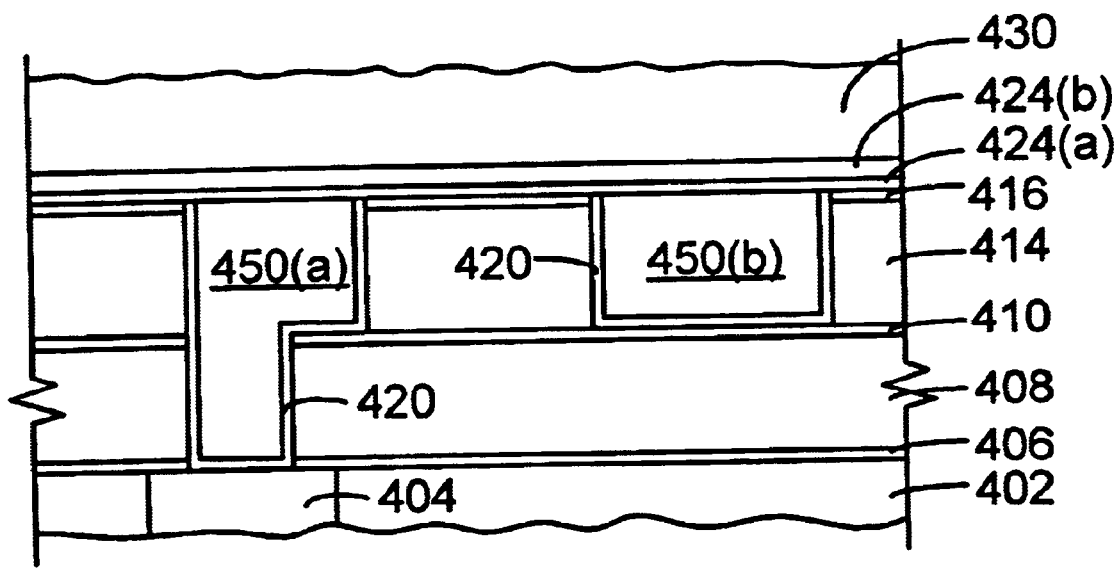

Referring to FIG. 2(f), after forming the first layer 424(a), a second layer 424(b) is formed on the first layer 424(a) (step 28 in FIG. 1). Like the first layer 424(a), the second layer 424(b) comprises silicon and the same element selected from the group consisting of nitrogen and carbon. However, the atomic ratio of the element to silicon in the first layer is greater than the atomic ratio of the element to silicon in the second layer.

The process used to form the second layer 424(b) may be similar to the process used to form the first layer 424(a). For example, if the second layer 424(b) comprises silicon and nitrogen, the gaseous mixture used to form the second layer 424(b) may include first compounds such as silane ($SiH_4$) and dichlorosilane ($SiH_2Cl_2$) and second compounds such as nitrogen ($N_2$) and ammonia ($NH_3$). However, one or more process parameters may differ between the process used to form the first layer and the process used to form the second layer. For example, when forming the second layer 424(b), the molar ratio of the second gas comprising nitrogen or carbon to the first gas (e.g., silane) may be greater than the molar ratio of these same gases when forming the first layer 424(a). The molar ratio of the gases may be changed by adjusting the gas flow rate of one or both of the first and second gases into the processing chamber. As a result of the different ratios of reactants used in the processes for forming the first layer and the second layer, the atomic ratio of nitrogen or carbon to silicon in the first layer 424(a) is greater than the atomic ratio of nitrogen or carbon to silicon in the second layer 424(b). For example, in embodiments of the invention, in the first layer, the atomic ratio of nitrogen or carbon, to silicon may be about 1.55, while the atomic ratio of nitrogen or carbon, to silicon in the second layer may be about 1.33 (e.g., $Si_3N_4$)

V. Forming a Dielectric Layer on the Second Layer

Referring to FIG. 2(e), after forming the second layer 424(b), a third dielectric layer 430 is formed on the second layer 424(b) (step 30 in FIG. 1). In one embodiment, the third dielectric layer 430, like the first and second dielectric layers 408, 414 comprises a porous material such as a mesoporous oxide. Although three dielectric layers 408, 414, 430 are shown in FIG. 2(e), it is understood that microelectronic devices according to embodiments of the invention may have any suitable number of dielectric layers.

A typical process for forming a porous oxide layer includes depositing a sol gel precursor solution on a substrate, curing the deposited sol gel precursor solution to form a porous oxide layer, and exposing the layer to an oxidizing environment (e.g., an ozone plasma) to remove any surfactant in the layer. Processing parameters such as times, temperatures, pressures, and relative concentrations of materials may be varied by those of ordinary skill in the art.

In some embodiments, a sol gel precursor solution is formed. A typical sol gel precursor solution may include silicon and oxygen-containing compounds, water, a surfactant, and an organic solvent. For example, the sol gel precursor solution may comprise a mixture of tetraethylorthosilicate (TEOS), ethanol, water, and a surfactant. An optional acid or base catalyst may also be added to the mixture.

The silicon and oxygen containing compounds can form silica particles that are used to form silica sols. Examples of silicon and oxygen containing compounds include tetraethoxysilane (TEOS), phenyltriethyloxy silane, methyltriethoxysilane, and tetramethoxysilane (TMOS).

Surfactants can be included in the sol gel precursor solution. They are used in sol gel precursor solution to disperse, e.g., silicon and oxygen containing compounds in the solution. Surfactants can ensure that the compounds are evenly distributed in the solution and in the formed layer. In embodiments of the invention, the surfactants may be anionic, cationic, or non-ionic. Exemplary surfactants can comprise or may be derived from primary amines, polyoxyethylene oxides-propylene oxide-polyethylene oxide triblock copolymers, octaethylene glycol monodecyl ether, octaethylene glycol monohexadecyl ether, and combinations thereof.

Any suitable solvent can be used in the solution. The solvent (e.g., an organic solvent) may serve as a vehicle that facilitates the deposition of the sol gel solution on the substrate. Examples of suitable solvents include water and alcohols such as those selected from the group consisting of ethanol, n-propanol, iso-propanol, n-butanol, sec-butanol, tert-butanol, and ethylene glycol.

After the sol gel precursor solution is formed, the sol gel precursor solution is deposited on a substrate. Any suitable deposition process may be used. For example, a spin coating process or a spray-coating process can be used to deposit the sol gel precursor solution. During a typical spin coating process, centrifugal draining allows the layer to substantially cover the substrate in a thin layer of sol gel precursor solution.

After the sol gel precursor solution is deposited on a substrate, it is cured. The curing process may comprise one or more heating steps between about 50° C. and about 450° C. In some embodiments, the curing process is performed for about one minute to about ten minutes. During curing, the solvent evaporates resulting in the removal of moisture in the layer. This can increase the concentration of non-volatile surfactant and silicon and oxygen containing compounds in the deposited solution. As heating continues, the silicon and oxygen compounds form particles that bind together in the thinning layer. Continued drying solidifies the forming porous layer and a microstructure may be formed in the layer. The porous layer may have a cubic phase and may be characterized as a mesoporous oxide layer in some embodiments.

After curing, the formed layer can be exposed to an oxidizing atmosphere at an elevated temperature to remove surfactant in the porous layer. In some embodiments, the temperature of the oxidizing atmosphere is in the range of about 200° C. to about 400° C. The oxidizing environment comprises a plasma formed from oxygen or ozone. The plasma may be present in a chamber that contains gas at a pressure of between about 0.5 Torr and about 10 Torr. In a typical embodiment, oxygen radicals bombard the layer and react with the surfactant and any remaining moisture and solvent, thereby removing them from the layer. The ion species are highly reactive and only require a short exposure of about 0.5 minutes to about 5 minutes for removal of the surfactant. As the surfactants are removed from the layer, pores continue to form and the porous layer hardens.

Alternatively or additionally, surfactant in the porous layer can be removed in a high temperature anneal process. For example, the anneal process may take place at about 400° C. to about 450° C. in some embodiments. The annealing process may also be performed at pressures ranging from near vacuum to atmospheric, and can take place for any suitable amount of time. The porous layer can also be annealed in a non-reactive atmosphere comprising an inert gas.

In some embodiments, the porous layer can be annealed when the precursor compounds comprise methyl or phenyl groups, such as in phenyltriethyloxy silane and methyltriethoxy silane. Annealing the porous layer made from methyl or phenyl containing precursor compound prevents oxidation and removal of methyl and phenyl compounds. With the retained methyl and phenyl groups, the layer has a higher carbon content, which is believed to provide for a lower dielectric constant layer.

After annealing, stripping and/or curing, a highly porous layer is formed on the substrate. The porous layer may have a porosity greater than about 50% (e.g., greater than 50% air) and may exhibit a dielectric constant of less than 2.5, or from about 2.2 to about 1.6. The porous layer may be a porous oxide layer and may also be characterized as a mesoporous oxide layer.

Mesoporous oxide layers are highly hydrophilic and sensitive to moisture contamination. Moisture (dielectric constant (k) >78) contamination in a mesoporous oxide layer can affect the layer's overall dielectric constant. Accordingly, a mesoporous oxide layer can be post-treated by silylating the porous layer and/or forming a capping layer on it. The capping layer may comprise any suitable material including silicon carbide or silicon nitride.

EXAMPLE

An exemplary process sequence for removing copper oxides and forming the first and second layers on a semiconductor substrate can be described. A semiconductor wafer with a copper structure (e.g., a layer with copper lines and vias) is placed on a wafer pedestal in a plasma processing chamber in a Centura DxZ CVD apparatus. This apparatus is commercially available from Applied Materials, Inc. of Santa Clara, Calif. The wafer pedestal is heated to about 400° C. and is maintained at this temperature for a copper oxide removal process using $NH_3$. The processing chamber is pumped down to about 4.2 Torr and is maintained at this pressure while the semiconductor wafer is in the processing chamber.

Ammonia and nitrogen are introduced into the processing chamber, at a flow rate of 100 sccm and 5000 sccm, respectively for about 10 seconds. After the gases are introduced, the RF power is turned on, which in turn turns on the plasma inside the chamber. The ionized ammonia molecules, remove the copper oxide at the surface of the copper structure. This process takes about 10 to 20 seconds. Immediately after the copper oxide removal treatment, silane is introduced into the chamber.

A plasma is formed in the processing chamber as power at 555 W is applied to the gases in the processing chamber. After a predetermined period of time (e.g., about 1 to 3 seconds), a silicon nitride layer that is "nitrogen-rich" and is about 60 angstroms thick is deposited on the copper structure on the semiconductor substrate. The nitrogen-rich first layer may have a nitrogen to silicon ratio of about 1.55.

After the predetermined period of time, the flow rate of silane into the processing apparatus is increased by a factor of about 4 (or more) to about 220 sccm, while the nitrogen flow is maintained at 5000 sccm and the power is maintained at 555 W. After a second predetermined amount of time (e.g., about 7 to about 20 seconds), the process for forming the second layer is completed. The formed second layer comprises nitrogen and silicon, has a thickness of about 500 angstroms and has a ratio of nitrogen to silicon of about 1.26.

After a cross-sectional analysis, no copper silicide is observed at the interface of the first layer and the copper structure.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention. For example, many processing details are described with respect to dual damascene processes. It is understood that these processing schemes could be to form, for example, microelectronics devices with conductive features made using subtractive processes.

What is claimed is:
1. A method comprising:
   (a) forming a conductive copper structure on a substrate;
   (b) forming a first layer on the conductive copper structure, wherein the first layer comprises a first silicon nitride of the formula $Si_xN_y$, wherein x and y are each greater than 0; and
   (c) forming a second layer on the first layer, wherein the second layer comprises a second silicon nitride of the formula $Si_xN_y$, wherein x and y are each greater than 0, wherein the atomic ratio of nitrogen to silicon in the first layer is greater than the atomic ratio of nitrogen to silicon in the second layer.
2. The method of claim 1 wherein the conductive copper structure comprises surface oxides, and wherein the method further comprises:
   (d) removing the surface oxides.
3. The method of claim 2 wherein (b), (c), and (d) are performed in the same processing apparatus.
4. The method of claim 1 wherein the conductive copper structure is present in a dielectric layer.
5. The method of claim 1 wherein (b) comprises forming the first layer using a plasma enhanced chemical vapor deposition (PECVD) process.
6. The method of claim 1 wherein (b) and (c) comprise using a plasma enhanced chemical vapor deposition (PECVD) process.
7. The method of claim 1 wherein (b) comprises using $SiH_4$ and $N_2$, without ammonia, to form the first layer and wherein (c) comprises using $SiH_4$ and $N_2$, without ammonia, to form the second layer, and wherein the molar ratio of $N_2$ to $SiH_4$ used in (b) is greater than the molar ratio of $N_2$ to $SiH_4$ in (c).
8. The method of claim 1 further comprising:
   forming a dielectric layer on the second layer.
9. The method of claim 8 wherein the dielectric layer comprises a porous oxide material.
10. The method of claim 1 wherein the ratio of nitrogen to silicon is about 1.2 to 1.4 in the second layer and wherein the ratio of nitrogen to silicon is greater than 1.4 in the first layer.

11. The method of claim 1 wherein the ratio of nitrogen to silicon is about 1.55 in the first layer and wherein the ratio of nitrogen to silicon is about 1.33 in the second layer.

12. The method of claim 1 wherein the first layer has a thickness less than about 60 angstroms, while the second layer has a thickness greater than about 100 angstroms.

13. The method of claim 1 wherein (b) comprises using a gaseous mixture consisting essentially of $SiH_4$ and $N_2$ to form the first layer and wherein (c) comprises using a gaseous mixture consisting essentially of $SiH_4$ and $N_2$ to form the second layer, and wherein the molar ratio of $N_2$ to $SiH_4$ used in (b) is greater than the molar ratio of $N_2$ to $SiH_4$ in (c).

14. The method of claim 1 wherein the conductive copper structure comprises surface oxides, and wherein the method further comprises (d) removing the surface oxides, and wherein (b), (c), and (d) are performed in the same plasma enhanced chemical vapor deposition (PECVD) apparatus, and wherein the PECVD apparatus has a faceplate with apertures, the apertures being conically shaped.

15. A method comprising:
    (a) forming a copper structure on a semiconductor substrate;
    (b) removing copper oxide at the surface of the copper structure;
    (c) forming a first layer comprising a first silicon nitride of the formula $Si_xN_y$, wherein x and y are each greater than 0, and wherein the first layer contacts the copper structure; and
    (d) forming a second layer comprising a second silicon nitride of the formula $Si_xN_y$, wherein x and y are each greater than 0 on the first layer,
        wherein the nitrogen to silicon ratio in the first layer is greater than the nitrogen to silicon ratio in the second layer, and
        wherein the second layer is thicker than the first layer.

16. The method of claim 15 further comprising:
    (e) forming a dielectric layer comprising a porous oxide material on the second layer.

17. The method of claim 16 wherein (e) comprises depositing a sol gel solution on the second layer, and then curing the sol gel layer.

18. The method of claim 15 wherein (b) occurs at a temperature less than about 350° C.

* * * * *